United States Patent [19]

Erbe

[11] Patent Number: 4,922,540
[45] Date of Patent: May 1, 1990

[54] HEARING AID COMPRISING A PRINTED CIRCUIT FILM

[75] Inventor: Ehrenfried Erbe, Effeltrich, Fed. Rep. of Germany

[73] Assignee: Siemens Aktiengesellschaft, Berlin and Munich

[21] Appl. No.: 202,828

[22] Filed: Jun. 6, 1988

[30] Foreign Application Priority Data

Jun. 26, 1987 [DE] Fed. Rep. of Germany ... 8708894[U]

[51] Int. Cl.$^5$ ............................................. H04R 25/00
[52] U.S. Cl. ................................. 381/69; 174/138 D; 381/69.2
[58] Field of Search ............... 381/69, 68, 68.7, 69.1, 381/69.2; 338/114; 361/398, 394, 395, 399; 200/52 R, 61.58 R; 174/138 D

[56] References Cited

U.S. PATENT DOCUMENTS

| | | | |
|---|---|---|---|
| 4,354,065 | 10/1982 | Buettner | 381/68.7 |
| 4,444,318 | 4/1984 | Alexander | 211/41 |
| 4,639,556 | 1/1987 | Hartl et al. | 381/68.6 |

FOREIGN PATENT DOCUMENTS

| | | |
|---|---|---|
| 7918029 | 4/1980 | Fed. Rep. of Germany |
| 8328734.5 | 3/1986 | Fed. Rep. of Germany |
| 8527362.7 | 3/1986 | Fed. Rep. of Germany |

OTHER PUBLICATIONS

*Hearing Instruments*, "Flexible Circuitry, Leadless Components and Vapor Phase Soldering", Longwell, T. et al., vol. 34, No. 2, Feb. 1983, pp. 4 and 46.

Primary Examiner—Jin F. Ng
Assistant Examiner—Danita R. Byrd
Attorney, Agent, or Firm—Hill, Van Santen, Steadman & Simpson

[57] ABSTRACT

In a hearing aid formed of a printed circuit film, the operating elements at the hearing aid housing are also utilized for holding the printed circuit film. Given employment of a multi-layer printed circuit film, the operating elements, and particularly a switch or a potentiometer, can be arranged between the layers such that the required spacing between the layers is guaranteed.

9 Claims, 1 Drawing Sheet

HEARING AID COMPRISING A PRINTED CIRCUIT FILM

RELATED APPLICATIONS

The present case is related to the following cases of the same inventor: "HEARING AID COMPRISING PRINTED CIRCUIT BOARD AND LISTENING COIL", U.S. Ser. No. 202,961 filed June 6,1988 and "HEARING AID COMPRISING PRINTED CIRCUIT BOARD", U.S. Ser. No. 202,829, filed June 6,1988.

BACKGROUND OF THE INVENTION

The present invention is directed to a hearing aid having a flexible printed circuit film held in a hearing aid housing.

When designing hearing aids, it is necessary to utilize the extremely small integration space in the hearing aid housing in as rational a manner as possible. The arrangement of the components such as, for example, an acoustic transducer, an energy source, switches, and an amplifier plate thus plays an extremely important role. Moreover, care must be exercised to see that the mounting devices of the individual elements use as little space as possible.

For example, German Utility Model 85 27 362, incorporated herein, discloses a behind-the-ear hearing aid comprising a boxshaped plastic container that is equipped with actuators. This container is combined with further plastic parts to form a structural unit that is arranged between the amplifier plate and the housing. Since the structural unit encompasses mounting elements both for the amplifier plate as well as for the housing, the amplifier plate is held in protected fashion against dislocation with respect to the housing. The structural unit is as rationally designed as possible since it also holds the actuators.

For reasons of saving space, amplifier plates have been arranged on two mounting levels, or the amplifiers have been recently designed as multi-coated, equipped, flexible circuit films. Such an arrangement, however, requires additional holding mechanisms in order to guarantee the spacing between the printed circuit film layers. Such amplifier arrangements having additional spacer projections are disclosed, for example, by German Utility Model No. 79 18 029, corresponding to U.S. Pat. No. 4,354,065, and by U.S. Pat. No. 4,444,318, both incorporated herein.

In order to recover the space lost to the spacing projections, German Utility Model No. 83 28 734 (U.S. Pat. No. 4,639,556), incorporated herein, has proposed that the flexible printed circuit film be clamped in large-area fashion between an operating element and the housing at a bent-off location. This solution, however, has certain disadvantages since the clamped area of the printed circuit film can no longer be used for other purposes. Moreover, this does not yet guarantee protection against dislocation (particularly a protection against turning) for the printed circuit film even if the operating element is held in anti-twist fashion.

SUMMARY OF THE INVENTION

It is an object of the present invention to mount the printed circuit film in the hearing aid housing such that it is protected against dislocation, without employing additional holding devices or spacer projections, and to thus achieve a space-saving in the hearing aid.

This object is achieved by providing a flexible printed circuit film in the hearing aid housing which has at least two bent printed circuit wings. At least one operating element of the hearing aid which is secured to the housing contributes to holding the printed circuit film against dislocation within the housing and functions as a spacer to guarantee a desired spacing between the printed circuit wings.

By employing an operating element for mounting the printed circuit film, it is possible to firmly hold the film at the housing by means of supports for the operating element. No additional space is thus wasted with further mounts. The surface of the printed circuit film used for mounting can also simultaneously form the electrical terminal of the operating element and can thus fulfill an additional purpose. Moreover, the operating element is simultaneously designed as a spacer of printed circuit films in two mounting levels.

DESCRIPTION OF THE PREFERRED EMBODIMENTS

Figure 1:
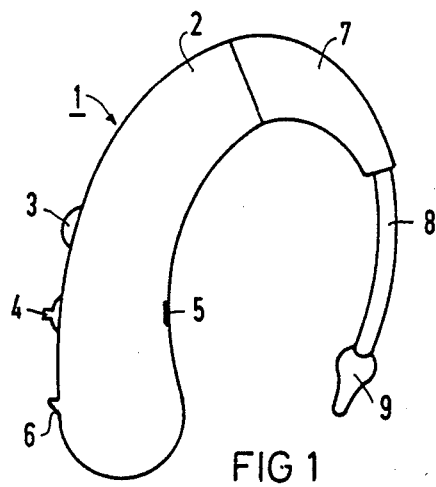
FIG. 1/is an outside view of a hearing aid to be worn behind the ear and containing the invention.

FIG. 1 shows a hearing aid 1 to be worn behind the ear whose housing 2 contains electrical as well as electro-mechanical elements for processing acoustic signals. This processing can be influenced by a number of operating elements accessible from the outside, for example a volume control 3, an on-off switch 4, and (not visible) actuator arrangement 5. The hearing aid 1 also comprises a battery compartment 6 and a carrying hook 7 at the opposite end. The processed, acoustic signals are supplied to the ear via a hose 8 secured to the carrying hook 7, and via an ear adapter member 9 adapted to the auditory canal of the hearing-impaired person.

Figure 2:
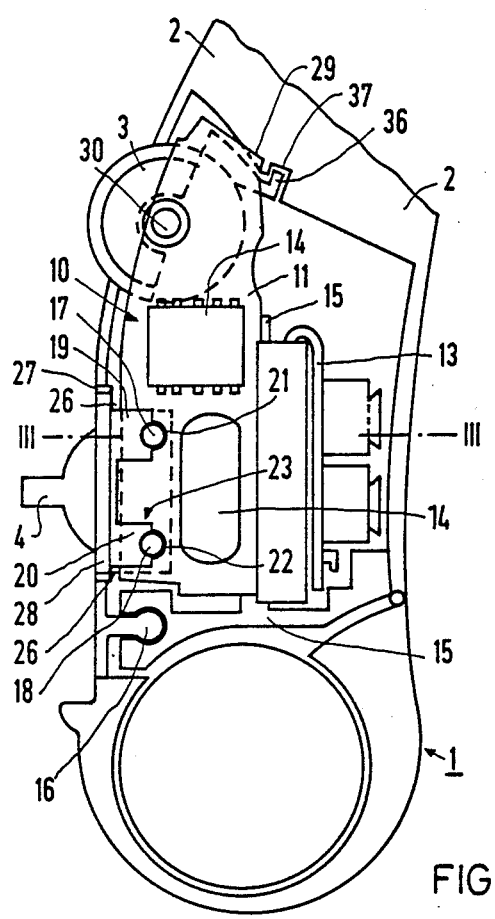
FIG. 2 is a side view of a printed circuit board that is held in the hearing aid housing by operating elements.

FIG. 2 shows an enlargement of the hearing aid 1 of FIG. 1 without the upper housing shell 2. Among other things, an amplifier arrangement is situated in the inside of the apparatus 1. It comprises a flexible, folded printed circuit film 10 having two printed circuit wings 11, 12 and an extension arm 13 on which various components 14 are situated. The printed circuit wings 11, 12 of the amplifier arrangement are folded around a carrier 15. The carrier 15 is secured to the housing 2 with a snap-in connection. A small cross-rod 16 projecting into the inside from the housing 2 provides this snap-in connection to the carrier 15 as shown in FIG. 2.

This connection, however, does not secure the printed circuit film 10 against rotations or small dislocations of the printed circuit wings 11, 12. The distal sides of the printed circuit wings 11, 12 are therefore secured to the operating elements 3 and 4.

Two transversely projecting stoppers 17, 18 are situated on a side 23 at that part of the switch box 4 projecting into the inside of the housing 2. The stoppers 17, 18 are designed such that they are supported at appropriately shaped housing projections 19, 20. The switch 4 cannot be pulled out through this support. The stoppers 17, 18 also hold the printed circuit wing 11 that is provided with corresponding eyelets 21, 22 at the distal end. The eyelets 21, 22 are pulled over the stoppers 17, 18 before the switch 4 in the housing 2 is positioned at the projections 19, 20. Since the switch 4 cannot move relative to the housing, the printed circuit wing 11 is also held and is thus protected against dislocation.

Figure 3:
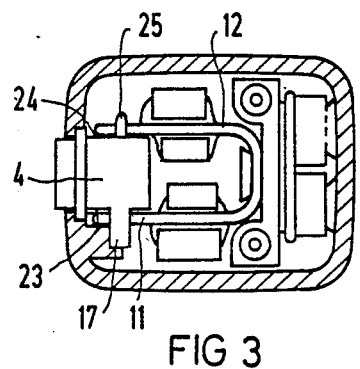
FIG. 3 illustrates the printed circuit board arrangement shown in FIG. 2 at cross-section III—III.

As may be seen from FIG. 3, the printed circuit wing 12 is secured with soldered contactings 25 to the electrical terminals of the switch 4 at the opposite side 24 of the switch 4. This printed circuit wing is thus also held in protected fashion against dislocation.

Since a part of the switch box 4 is situated between the printed circuit wings 11 and 12, it is impossible for the printed circuit wings 11, 12 to proceed against one another. The switch 4 thus also simultaneously serves as a spacer for the two printed circuit wings 11, 12.

The switch 4 is protected against being pushed in at the housing shell (see FIG. 2). Supporting shoulders 26 that frame the opening 27 for the switch 4 are situated there. Accordingly, the switch 4 comprises a frame 28 that is seated on the supporting shoulders 26 when the switch 4 has been integrated into the housing 2.

FIG. 2 also shows a potentiometer arrangement 3 that holds the outermost end 29 of the printed circuit wing 11 protected against dislocation. As in the case of the switch 4, the connection between the potentiometer 3 and the printed circuit wing 11 is fashioned as a stopper/eyelet connection. In this case, too, the stopper 30 designed as a screw is situated at the operating element 3, and the eyelet 31 is situated in the printed circuit wing. The stopper 30 is simultaneously the rotational shaft as well as one electrical terminal of the potentiometer 3. The eyelet 31 is accordingly provided with an electrical contact.

Figure 4:
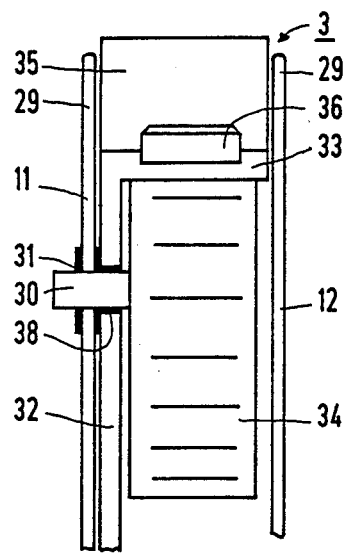
FIG. 4 is a plan view of a potentiometer arrangement according to the invention.

Potentiometer 3 and printed circuit wings 11, 12 are shown in an even greater enlargement in FIG. 4 in order to more clearly show the mounting between the potentiometer 3 and the printed circuit wings 11, 12. In addition to the stopper/eyelet connection 30, 31, the mount comprises a backing plate 32 that is secured to the printed circuit wing 11 in order to stabilize it in the region of the potentiometer 3. The backing plate 32 comprises an opening 38 for the stopper 30 of the potentiometer 3. It is also connected to a hood 33 for the rotary knob 34 of the potentiometer 3. A cross-web 35 is situated on the hood 33, this cross-web 35 comprising the width between the printed circuit wings 11, 12. It thus serves as a spacer for the outermost ends 29 of the printed circuit wings 11, 12. A hook 36 projects from the cross-web 35. It is provided for holding the potentiometer 3 relative to the housing and fits into a corresponding recess 37 (shown in FIG. 2) in the housing 2 of the hearing aid 1.

Although various minor changes and modifications might be proposed by those skilled in the art, it will be understood that I wish to include within the claims of the patent warranted hereon all such changes and modifications as reasonably come within my contribution to the art.

I claim as my invention:

1. A hearing aid comprising:
a hearing aid housing;
a flexible printed circuit film retained in the hearing aid housing and having at least two bent printed circuit wings;
at least one operating element being secured to the housing of the hearing aid;
said at least one operating element having means associated therewith both for holding at least one of the printed circuit wings of the printed circuit film against dislocation relative to the housing and also for maintaining a spacing between the two printed circuit wings;
said means associated with the operating element comprising a stopper and eyelet connection between the operating element and one of the printed circuit film wings; and
said stopper being positioned against anti-dislocation means on the housing.

2. A hearing aid comprising:
a hearing aid housing;
a flexible printed circuit film retained in the hearing aid housing and having at least two bent printed circuit wings;
at least one operating element being secured to the housing of the hearing aid;
said at least one operating element having means associated therewith both for holding at least one of the printed circuit wings of the printed circuit film against dislocation relative to the housing and also for maintaining a spacing between the two printed circuit wings; and
the operating element comprising a switch, said switch having two stoppers projecting outwardly therefrom which are plugged through corresponding eyelets in at least one printed circuit wing of the printed circuit film and ends of the stoppers being supported against formed sections connected to the housing, said formed sections being adapted to the contour of the stoppers.

3. A hearing aid according to claim 2 wherein said formed sections are designed as housing projections.

4. A hearing aid according to claim 2 wherein a side of the switch lying opposite a side where the stoppers are located has electrical terminals for switch contacts, the two printed circuit wings being bent along sides of the switch such that the one printed circuit wing is hooked into the stoppers by eyelets and the other printed circuit wing is retained by solder contactings at the electrical terminals of the switch.

5. A hearing aid according to claim 2 wherein the switch has a frame means for additional support of the switch relative to the housing, and said frame means being partly insertable into a corresponding opening in the housing provided with supporting shoulders.

6. A hearing aid, comprising:
a hearing aid housing;
a flexible printed circuit film retained in the hearing aid housing and having at least two bent printed circuit wings;
at least one operating element being secured to the housing for the hearing aid;
said at least one operating element having means associated therewith both for holding at least one of the printed circuit wings of the printed circuit film against dislocation relative to the housing and also for maintaining a spacing between the two printed circuit wings; and
said operating element comprising a rotary potentiometer, a rotary shaft of the potentiometer functioning as a stopper received in an eyelet in the printed circuit film.

7. A hearing aid according to claim 6 wherein the potentiometer includes a backing plate means for positioning one of the printed circuit wings, and said potentiometer having hook means for hooking into the housing to protect the potentiometer against turning and dislocation, and the potentiometer having an opening associated therewith for the rotary shaft thereof, and the printed circuit film wing having an eyelet therein passing over the rotary shaft.

8. A hearing aid according to claim 7 wherein the potentiometer includes a cross-web means in association with the backing plate means for providing a spacing between outermost ends of the printed circuit wings. the switch relative to the housing, and said frame means being partly insertable into a corresponding opening in the housing provided with supporting shoulders.

9. A hearing aid according to claim 7 wherein said hook means hooks into a recess at an inside of the housing.

* * * * *